United States Patent [19]

Tracy et al.

[11] Patent Number: 5,834,565
[45] Date of Patent: Nov. 10, 1998

[54] CURABLE POLYPHENYLENE ETHER-THERMOSETTING RESIN COMPOSITION AND PROCESS

[75] Inventors: James E. Tracy, Warsaw, Ohio; Gary William Yeager, Schenectady, N.Y.

[73] Assignee: General Electric Company, Pittsfield, Mass.

[21] Appl. No.: 747,535

[22] Filed: Nov. 12, 1996

[51] Int. Cl.$^6$ ............... C08L 71/12; C08L 63/00; C08F 283/08

[52] U.S. Cl. ............... 525/391; 525/390; 525/393; 525/395; 525/396; 525/397; 523/433; 524/540

[58] Field of Search ............... 525/391, 393, 525/395, 396, 397, 390; 523/433; 524/540

[56] References Cited

U.S. PATENT DOCUMENTS

| | | |
|---|---|---|
| 3,367,978 | 2/1968 | White . |
| 3,367,990 | 2/1968 | Bremmer . |
| 3,375,298 | 3/1968 | Fox . |
| 3,468,824 | 9/1969 | Williams . |
| 3,475,513 | 10/1969 | Benson ............... 525/396 |
| 3,652,710 | 3/1972 | Holub ............... 525/393 |
| 3,689,444 | 9/1972 | Wolfe . |
| 3,763,088 | 10/1973 | Izawa et al. . |
| 3,812,214 | 5/1974 | Markovitz . |
| 4,137,275 | 1/1979 | Smith et al. . |
| 4,496,695 | 1/1985 | Sugio et al. . |
| 4,579,992 | 4/1986 | Kaufhold et al. . |
| 4,661,559 | 4/1987 | Gardner et al. . |
| 4,677,144 | 6/1987 | Yasuda et al. . |
| 4,695,745 | 9/1987 | Mimoto et al. . |
| 4,757,117 | 7/1988 | Moss . |
| 4,853,423 | 8/1989 | Walles et al. . |
| 4,920,164 | 4/1990 | Saski et al. . |
| 4,975,319 | 12/1990 | Walles et al. . |
| 5,001,010 | 3/1991 | Chao et al. . |
| 5,043,367 | 8/1991 | Hallgren et al. . |
| 5,078,657 | 1/1992 | Qureshi et al. . |
| 5,096,771 | 3/1992 | Walles et al. . |
| 5,108,842 | 4/1992 | Hallgren et al. . |
| 5,124,415 | 6/1992 | Sakamoto et al. . |
| 5,141,791 | 8/1992 | Chao et al. . |
| 5,162,450 | 11/1992 | Chao et al. . |
| 5,213,886 | 5/1993 | Chao et al. . |
| 5,478,599 | 12/1995 | Iyer et al. . |

FOREIGN PATENT DOCUMENTS

| | | |
|---|---|---|
| Sho 50-15519 | 6/1975 | Japan . |
| Sho 54-156076 | 12/1979 | Japan . |
| Sho 57-145127 | 9/1982 | Japan . |
| 58-69052 | 4/1983 | Japan . |
| 219217 | 12/1983 | Japan . |
| 60-154056 | 7/1985 | Japan . |
| 60-248344 | 11/1985 | Japan . |
| 61-9437 | 12/1985 | Japan . |
| 61-9438 | 12/1985 | Japan . |
| Sho 61-84244 | 4/1986 | Japan . |
| 61-217239 | 9/1986 | Japan . |
| Sho 61-286130 | 12/1986 | Japan . |
| 61-293260 | 12/1986 | Japan . |
| 62-19446 | 1/1987 | Japan . |
| 62-55995 | 3/1987 | Japan . |
| 62-129319 | 5/1987 | Japan . |
| Sho 62-149728 | 5/1987 | Japan . |
| Sho 62-124146 | 6/1987 | Japan . |
| 62-148564 | 7/1987 | Japan . |
| 62-235335 | 10/1987 | Japan . |
| 62-245695 | 10/1987 | Japan . |
| 62-248632 | 10/1987 | Japan . |
| 63-3946 | 12/1987 | Japan . |
| 63-69633 | 3/1988 | Japan . |
| 63-156835 | 6/1988 | Japan . |
| 63-159443 | 6/1988 | Japan . |
| 1823 | 1/1994 | Japan . |
| 32876 | 2/1994 | Japan . |
| 200054 | 7/1994 | Japan . |
| 206955 | 7/1994 | Japan . |
| 211964 | 8/1994 | Japan . |
| 363720 | 11/1973 | Russian Federation . |

OTHER PUBLICATIONS

Delvigs "Tetraglycidyl Epoxy Resins . . . " *Polymer Composites* Apr. 1986 vol. 7 No. 2 pp. 101–105.

*Primary Examiner*—David Buttner

[57] ABSTRACT

Polyphenylene ether-thermosetting resin compositions are provided that are useful as dielectrics, particularly printed circuit boards having improved processability, good solvent and solder resistance, as well as improved morphology as compared to other polyphenylene ether-thermosetting resin compositions. More specifically, the particular polyphenylene ether resin component of this invention has a molecular weight of less than about 3,000 number average in contrast to higher molecular weight polyphenylene ethers employed in other polyphenylene ether-thermosetting resin compositions for use in preparing printed circuit boards.

51 Claims, No Drawings

CURABLE POLYPHENYLENE ETHER-THERMOSETTING RESIN COMPOSITION AND PROCESS

FIELD OF THE INVENTION

This invention relates to a polyphenylene ether-thermosetting resin compositions useful as dielectrics, particularly printed circuit boards having improved processability, good solvent and solder resistance, as well as improved morphology as compared to other polyphenylene ether-thermosetting resin compositions. More specifically, the particular polyphenylene ether resin component of this invention has a molecular weight of less than about 3,000 number average in contrast to higher molecular weight polyphenylene ethers employed in other polyphenylene ether-thermosetting resin compositions for use in preparing printed circuit boards.

BACKGROUND OF THE INVENTION

Curable thermosetting resin compositions containing polyphenylene ether (hereinafter referred to as PPE) are known in the art as useful dielectrics. Such compositions, generally in the form of fiber reinforced prepregs (i.e., substrates impregnated with uncured or partially cured resins), undergo cure to form materials with low dielectric constants and other favorable properties, including solvent resistance and solder resistance. Such materials are ideal for use as, for example, copper-clad laminates suitable for etching to form printed circuit boards. The initial production of the fiber reinforced prepreg is an important part of the lamination process and generally involves infusing a solution of the resin into a fibrous substrate such as glass.

When employing a resin solution, a number of solvents have been used including, for example, dichloromethane, chloroform, trichloroethylene, benzene, toluene and xylene. In practice, these solvents can be used individually or in combination to dissolve the polyphenylene ether composition. Because of deleterious health effects associated with halogenated hydrocarbons and benzene, it is preferable to use substituted aromatic hydrocarbons, in particular toluene, as the solvent for prepreg manufacture. When employing a polyphenylene ether-thermosetting resin composition such as a polyphenylene ether-epoxide composition using an inert organic solvent such as toluene to prepare printed circuit boards, gelation of the resin solution generally occurs at room temperature. The gelation is believed to be PPE that is separating from the organic solution yet remains highly swelled by the solvent. A number of PPE compositions are known to exhibit this phenomenon including polyphenylene ether-epoxide compositions described in U.S. Pat. No. 5,162,450 and Japanese patent application 6[1994]-200054.

The polyphenylene ether-epoxide containing prepregs described in U.S. Pat. No. 5,162,450 need to be maintained at about 55° C. to inhibit PPE gel formation and maintain a well behaved fluid. The aforementioned Japanese patent application 6[1994]-200054, teaches that PPE gelation (translated as waxification) can be overcome by dissolving the PPE at elevated temperatures (80°–88° C.) and infusing the glass cloth at (45°–50° C.).

We have unexpectedly found that prepregs can be produced from toluene solutions of polyphenylene ether-thermosetting resins at room temperature (ca. 23° C.) without any observed gelation if the number average molecular weight of the PPE in the mixture is maintained at below 3,000.

Commercially available PPE vary in number average molecular weight from roughly 15,000–25,000. Lower molecular weight PPE have been used, such as those employed in U.S. Pat. No. 5,162,450 which discloses a number average molecular weight of about 3,000 to about 15,000 and, preferably, 5,000–10,000. However, even though the PPE component of the U.S. Pat. No. 5,162,450 patent is a relatively low molecular weight (3,000–15,000), PPE gelation nevertheless occurs upon standing at room temperature in solution. Moreover, in the cured state two distinct phases, corresponding to PPE rich and polyepoxide rich domains, are observed.

Japanese Patent Disclosure Publication No. 1983-219217 describes a relatively low number average molecular weight PPE in combination with an epoxy resin potentially useful as dielectrics for printed circuit boards. The number average molecular weight of the PPE disclosed therein is less than 10,000 and, preferably, 1,000–8,000. However, it does not describe the use of such a composition in a substituted hydrocarbon solvent such as toluene, and mentions the use of high temperatures with respect to other aromatic solvents. The example in this reference is directed to a molding composition and the molecular weight of the PPE disclosed in the Example has a number average molecular weight greater than about 5,000. The polymer described in the Example, in a substituted hydrocarbon solvent such as toluene, will gel upon standing at room temperature and would, therefore, require maintaining the resin solution at elevated temperatures. In the cured state, it is expected that the resin system would not be homogenous as in the instant invention which employs a PPE having a specific number average molecular weight of less than 3,000.

Thus, the composition of the prior art requires maintaining the PPE containing solution at elevated temperatures that can afford environmental and health risks associated with the solvent vapors. Lowering the solvent temperature in the prior art would lead to gelation and separation of the PPE in the organic solution. The cured PPE containing thermosets of the prior art additionally exhibit undesirable phase separation that results in less than optimal physical properties. It is therefore apparent that a need continues to exist for improved PPE-thermoset compositions.

SUMMARY OF THE INVENTION

This invention is directed to a resin composition having better processability, exhibiting no gelation at room temperature (i.e., about 23° C.) when dissolved in a solvent such as toluene, and forming a single phase in the cured state. The cured resin composition still maintains favorable solvent resistance, solder resistance, and dielectric properties. Specifically, the composition of this invention comprises the mixture of PPE and a thermosetting component. Thermosetting components are known in the art and are polymers that form a three-dimensional cross-linked network of polymer chains that cannot be softened or reheated for additional use. Thermoset materials before they are cross-linked are fluid and must contain enough functionality or reactive sites to form a three-dimensional network. General classes of thermosetting resins include, for example, epoxy, phenolic, alkyds, polyester, polyimide, polyurethane, mineral filled silicone, bis-maleimides, cyanate esters, vinyl, and benzo-cyclobutene resins. These compositions may further contain various catalysts, flame retardants, curing agents and other constituents, if so desired. The thermosetting components, such as those described above, may be used either alone or in combination with one another or with another thermoplastic resin. When used to impregnate suitable fibrous reinforcing materials such as glass fiber cloth, they furnish compatible prepregs, particularly applicable for preparing laminated articles suitable for such applications as printed circuit boards or any other articles where good dielectric properties are desired. Said compositions, before crosslinking, are readily soluble in organic solvents, e.g., toluene, at room temperature without gelling, which facilitates solution impregnation of a substrate at room temperature. The cured materials prepared therefrom are highly solder resistant, solvent resistant, and flame retardant. The cured materials also have excellent dielectric properties and dimensional stability at high temperatures.

DESCRIPTION OF THE INVENTION

The composition of this invention comprises (a) a PPE having an average molecular weight of less than about 3,000, preferably about 500 to about 2,900 and, more particularly, about 800 to about 2,200, and (b) a thermosetting component. The compositions preferably contain a curing catalyst in an effective amount to cure the composition. The thermosetting component is at least one selected from the group consisting of epoxy, phenolic, alkyds, polyester, polyimide, polyurethane, mineral filled silicone, bis-maleimides, cyanate esters, vinyl, and benzocyclobutene resins. The composition may optionally contain another thermoplastic resin other than PPE. The PPE employed herein includes functionalized PPE having a number average molecular weight of less than 3,000. A useful functionalized PPE may be prepared with an oxidizing agent such as benzoyl peroxide or a mixture of a peroxide and a phenol such as bisphenol-A. The functionalized PPE may also be prepared by allowing PPE to react with a species containing both a carbon—carbon double or triple bond and a reactive moiety such as acid, anhydride, amine, imide, epoxy, oxazoline, orthoester, hydroxyl, phosphate, phosphonate, and the like. Illustrative examples of such species include, for example, maleic anhydride, fumaric acid, and citraconic anhydride. Aliphatic polycarboxylic acids, such as citric acid and malic acid, are also useful to prepare an appropriate functionalized PPE. The functionalized PPE is believed to be a PPE containing grafted residues derived from the reactive species. The composition of this invention may also include a halogen, preferably bromine, containing material. A preferred halogen containing material contains at least about 5% chemically combined bromine. Therefore, a preferred composition of this invention in the uncured state comprises:

(a) a PPE having a number average molecular weight of less than 3,000 wherein the PPE is selected from the group consisting essentially of PPE, a functionalized PPE, and mixtures of PPE and functionalized PPE; and (b) a thermosetting resin such as epoxy, phenolic, alkyds, polyester, polyimide, polyurethane, mineral filled silicone, bis-maleimides, cyanate esters, vinyl, and benzocyclobutene resins, or other thermosetting resins, or mixtures thereof.

In a preferred embodiment, the composition further comprises a catalyst in an amount sufficient to cure the thermosetting resin.

The above composition is soluble in an effective amount of an inert solvent such as, for example, toluene. At room temperature, gelation of the resin solution does not occur upon standing and, therefore, allows room temperature application of the resin system of this invention.

Preferably, the curable composition comprises about 5–95% of the PPE composition of (a) above and about 95–5% of a thermosetting resin composition of (b) above. All percentages are on a weight basis and are based on the total weight of (a) and (b).

PPE, per se, are known polymers comprising a plurality of structural units of the formula (I):

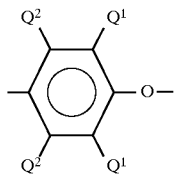

wherein for each structural unit, each $Q^1$ is independently halogen, primary or secondary lower alkyl (e.g., alkyl containing up to 7 carbon atoms), phenyl, haloalkyl, aminoalkyl, hydrocarbonoxy, or halohydrocarbonoxy wherein at least two carbon atoms separate the halogen and oxygen atoms; and each $Q^2$ is independently hydrogen, halogen, primary or secondary lower alkyl, phenyl, haloalkyl, hydrocarbonoxy or halohydrocarbonoxy as defined for $Q^1$. Preferably, each $Q^1$ is alkyl or phenyl, especially $C_{1-4}$ alkyl, and each $Q^2$ is hydrogen.

Both homopolymer and copolymer PPE are included. The preferred homopolymers are those containing 2,6-dimethyl-1,4-phenylene ether units. Suitable copolymers include random copolymers containing, for example, such units in combination with 2,3,6-trimethyl-1,4-phenylene ether units. Also included are PPE containing moieties prepared by grafting vinyl monomers or polymers such as polystyrenes, as well as coupled PPE in which coupling agents such as low molecular weight polycarbonates, quinones, heterocycles and formals undergo reaction in known manner with the hydroxy groups of two PPE chains to produce a higher molecular weight polymer. Such polymers may be produced by polymerization in the manner described in the presence or absence of a chain stopper or bisphenol as described in the prior art.

Also included are PPE containing other substituents grafted onto the polymer. These polymers are described in the patent literature and may be prepared by grafting such other substituents onto the polyphenylene ether in a known manner. Included are PPE grafted with polymeric resins such as polystyrene, polybutadiene, or other vinyl containing polymers.

In a preferred embodiment, it is preferable for at least some of the PPE to be a "functionalized PPE." Functionalized PPE refers to PPE that contain species such as acid, anhydride, amine, imide, epoxy, oxazoline, orthoester, hydroxyl, phosphate, phosphonate, and the like. In the final blend, the functionalized PPE are commonly referred to as "compatibilized PPE" because of the resultant improved compatibility between the PPE and the other components. Accordingly, appropriate functionalized PPE are those which affect the compatibility of the PPE with the various components of the blend (e.g., the PPE and the thermosetting resin). Compatibility is meant to include the stabilization of gross phase separation between the components of the blend. Indicators of improved compatibilization include, for example, reduced lamination tendency, increased ductility and improved phase morphology stabilization. It is through the effect of improving the compatibility of the blend components which determines, in part, the desirable physical properties of the blend.

One way to prepare appropriate functionalized PPE is to allow the PPE to react with at least one compound having both (i) a carbon—carbon double bond or a carbon—carbon triple bond and (ii) at least one species of the group consisting of carboxylic acids, acid anhydrides, acid amides, imides, amines, hydroxyls and carboxylic acid ammonium salts. These compounds are sometimes referred to as functionalizers. Illustrative compounds used to accomplish the functionalization of the PPE include maleic anhydride, fumaric acid, maleimides such as N-phenylmaleimide and 1,4-phenylene-bis-methylene-α,α'-bismaleimide, maleic hydrazide, methylnadic anhydride, fatty oils (e.g., soybean oil, tung oil, linseed oil, sesame oil), unsaturated carboxylic acids such as acrylic, crotonic, methacrylic acid and oleic acid, unsaturated alcohols such as allyl alcohol and crotyl alcohol and unsaturated amines such as allylamine and trialkyl amine salts of unsaturated acids such as triethylammonium fumarate and tri-n-butylammonium fumarate. Examples of such typical reagents for preparing useful functionalized PPE are described in U.S. Pat. Nos. 4,315,086, 4,755,566, and 4,888,397, which are incorporated herein by reference.

Non-polymeric aliphatic polycarboxylic acids are also useful for preparing an appropriate nucleophile containing PPE. Included in this group of species, also known as compatibilizers or functionalizers, are, for example, the aliphatic polycarboxylic acids, and acid esters represented by the formula (II):

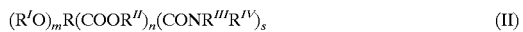

$$(R^IO)_mR(COOR^{II})_n(CONR^{III}R^{IV})_s \qquad (II)$$

wherein R is a linear or branched chain, saturated aliphatic hydrocarbon of from 2 to 20, preferably 2 to 10, carbon atoms; $R^I$ is selected from the group consisting of hydrogen or an alkyl, aryl, acyl, or carbonyl dioxy group of 1 to 10, preferably 1 to 6, most preferably 1 to 4, carbon atoms, with hydrogen being especially preferred; each $R^{II}$ is independently selected from the group consisting of hydrogen or an alkyl or aryl group of from 1 to 20 carbon atoms preferably from 1 to 10 carbon atoms; each $R^{III}$ and $R^{IV}$ is independently selected from the group consisting essentially of hydrogen or an alkyl or aryl group of from 1 to 10, preferably from 1 to 6, most preferably 1 to 4, carbon atoms; m is equal to 1 and (n+s) is greater than or equal to 2, preferably equal to 2 or 3, and n and s are each greater than or equal to zero; and wherein ($OR^I$) is alpha or beta to a carbonyl group and at least two carbonyl groups are separated by 2 to 6 carbon atoms. Obviously, $R^I$, $R^{II}$, $R^{III}$ and $R^{IV}$ cannot be aryl when the respective substituent has less than 6 carbon atoms.

Illustrative of suitable polycarboxylic acids are citric acid, malic acid, and agaricic acid; including the various commercial forms thereof, such as, for example, the anhydrous and hydrated acids. Illustrative acid esters useful herein include, for example, acetyl citrate and mono- and/or di-stearyl citrates and the like. Suitable acid amides useful herein include, for example, N,N'-diethyl citric acid amide; N,N'-dipropyl citric acid amide; N-phenyl citric acid amide; N-dodecyl citric acid amide; N,N'-didodecyl citric acid amide and N-dodecyl malic acid amide. Derivatives of the foregoing polycarboxylic acids are also suitable for use in the practice of the present invention. Examples of suitable functionalizing compounds can be found in U.S. Pat. Nos. 4,315,086, 4,755,566, 4,873,286 and 5,000,897, all of which are incorporated herein by reference.

The amount of the above mentioned functionalizing agents that is required to appropriately functionalize the PPE is that which is sufficient to improve the compatibility between the various components in the composition. As previously discussed, indications of improved compatibility include resistance to lamination, improved physical properties, and a stabilized morphology between the blend component phases under static or low shear conditions. It is thought that reactions can occur between some of the components of the composition, for example between the PPE and the thermosetting resin and/or between the functionalized PPE and the thermosetting resin. These reactions are believed to lead to various copolymers between the components of the blend. An effective amount of the above mentioned functionalizing agents, based on the amount of the PPE, is generally up to about 8% by weight, and is preferably from about 0.05% to about 4% by weight. In the most preferred embodiments, the amount of the functionalizing agent is in the range of about 0.1% to about 2.0% by weight based on the amount of the PPE. The actual amount utilized will also depend on the molecular weight of the functionalizing agent, the number and type of reactive species per molecule of functionalizing agent, the type of thermosetting resin employed, the crosslinking agent type and amount present, and the degree of compatibility that is desired in the final composition. One of ordinary skill in the art will be able to determine an appropriate level without undue experimentation.

Another useful method for preparing an appropriate functionalized PPE involves allowing the PPE to react with a compound containing an acyl functional group and one of the aforementioned species or a species capable of being transformed into one of these species. Non-limiting examples include chloroformyl succinic anhydride, chloroethanoyl succinic anhydride, trimellitic anhydride acid chloride, 1-acetoxy-acetyl-3,4-dibenzoic acid anhydride, and terephthalic acid acid chloride. Additional examples and methods to prepare such functionalized PPE can be found in U.S. Pat. Nos. 4,600,741 and 4,642,358, each of which is incorporated herein by reference. The aforementioned methods for preparing a functionalized PPE may be used alone or in combination with one another.

The PPE are typically prepared by the known oxidative coupling of at least one corresponding monohydroxyaromatic compound. Particularly useful and readily available monohydroxyaromatic compounds are 2,6-xylenol (wherein each Q1 is methyl and each Q2 is hydrogen), whereupon the polymer may be characterized as a poly (2,6-dimethyl-1,4-phenylene ether), and 2,3,6-trimethylphenol (wherein each Q1 and one Q2 are methyl and the other Q2 is hydrogen). In addition, these materials can be copolymerized with a chain stopper such as 2,4,6 trimethylphenol.

A variety of catalyst systems are known for the preparation of polyphenylene ethers by oxidative coupling. There is no particular limitation as to catalyst choice and any of the known catalysts can be used. For the most part, they contain at least one heavy metal compound such as a copper, manganese or cobalt compound, usually in combination with various other materials.

A first class of preferred catalyst systems consists of those containing a copper compound. Such catalysts are disclosed, for example, in U.S. Pat. Nos. 3,306,874, 3,306,875, 3,914,266 and 4,028,341. They are usually combinations of cuprous or cupric ions, halide (i.e., chloride, bromide or iodide) ions and at least one amine.

Catalyst systems containing manganese compounds constitute a second preferred class. They are generally alkaline systems in which divalent manganese is combined with such anions as halide, alkoxide or phenoxide. Most often, the manganese is present as a complex with one or more complexing and/or chelating agents such as dialkylamines, alkanolamines, alkylenediamines, o-hydroxyaromatic aldehydes, o-hydroxyazo compounds, w-hydroxyoximes (monomeric and polymeric), o-hydroxyaryl oximes and α-diketones. Also useful are known cobalt-containing catalyst systems. Suitable manganese and cobalt-containing catalyst systems for polyphenylene ether preparation are known in the art by reason of disclosure in numerous patents and publications.

It will be apparent to those skilled in the art from the foregoing that apart from the molecular weight considerations dealt with herein, the PPE contemplated for use in the present invention include all those presently known and those under development by, for example, General Electric Company, irrespective of variations in structural units or ancillary chemical features.

For the purposes of this invention, the PPE composition (including any functionalized PPE) has a number average molecular weight of less than about 3,000, as determined by Gel Permeation Chromatography (GPC). This lower molecular weight PPE composition when combined with an uncured thermosetting resin produces a curable composition that is highly soluble in organic solvents (such as toluene), does not gel at room temperature, and exhibits excellent flow characteristics for effectively filling all voids when used to impregnate a substrate material such as glass cloth. In the cured state, the composition exhibits superior single phase morphology of the PPE-thermosetting formulation. The number average molecular weight of the PPE in the composition is less than about 3,000, preferably in the range of about 500 to about 2,900 and, most preferably, from about 800 to about 2,200 and especially, from about 1,000 to about 1,600.

Low molecular weight PPE of the type employed herein are not readily available as commercial products at present. In one procedure, low molecular weight PPE are prepared from PPE typically having a number average molecular weights in the range of about 15,000–25,000. Such preparation of a low molecular PPE composition can be accomplished by reacting the PPE with an oxidizing agent such as a peroxide or a quinone with or without a phenol (including bisphenols). Another procedure is to obtain a low molecular weight PPE by oxidative coupling as described above to produce resins of less than 3,000 number average molecular weight which are isolated, preferably, by a direct isolation method. However, even such low molecular weight resins can optionally be functionalized with a peroxide or peroxide and a phenol to achieve even lower molecular weight.

Phenolics useful in the redistribution reaction described herein include those exemplified by Formula (III):

$$A^1\text{---}[X]_n \qquad (III)$$

Wherein A1 is any aromatic, aliphatic, mixed aliphatic-aromatic hydrocarbons, heterocycles or derivatives of the like, X is a hydroxy residue and n is any integer from 1 to about 200 and, preferably, from 1 to about 5.

As previously stated, the PPE number average molecular weight (Mn) may be reduced by reacting the PPE directly with a peroxide or with a peroxide and a phenol. In general, any peroxide would be useful in the instant invention and would include those described by the following Formula (IV):

$$A2\text{---}O\text{---}O\text{---}A3 \qquad (IV)$$

wherein A2 and A3 are any aliphatic acyl, aromatic acyl group, alkyl, or mixed aliphatic-aromatic hydrocarbon, hydrogen or inorganic ester moiety or derivatives of the like.

Typical of peroxides useful in this invention include without limitation:

1) Diacyl peroxides such as dibenzoyl peroxide, 4,4'-di-t-butylbenzoyl peroxide or other aryl-substituted derivatives, dilauryl peroxide, acetyl benzoyl peroxide, acetyl cyclohexylsulfonyl peroxide or diphthaloyl peroxide.

2) Peroxydicarbonates such as dicetylperoxydi-carbonate.

3) Peroxyacids such as perbenzoic acid, 3-chloroperbenzoic acid, 4-nitroperbenzoic acid, and other substituted derivatives of perbenzoic acid, peroxyacetic, peroxypropanoic acid, peroxybutanoic acid, peroxy-nonanoic acid, peroxydodecanoic acid, diperoxyglutaric acid, diperoxyadipic acid, diperoxy-octanedioic acid, diperoxynonanedioic acid, diperoxy-decanedioic acid, diperoxydodecandioic acid, monoperoxyphthalic acid, as well as the inorganic acids such as peroxysulfuric acid, peroxydisulfuric acid, peroxyphosphoric acid, peroxydi-phosphoric acid and their corresponding salts.

4) Peroxycarboxylic esters such as t-butyl performate, t-butyl peracetate, t-butyl peroxyiso-butyrate, t-butyl perbenzoate, cumyl perbenzoate, t-butyl peroxynonanoate, t-butyl monoperoxymaleate, t-butyl monoperoxyphthalate, di-t-butyl diperoxyadipates, 2,5-dimethyl-2,5-bis(benzoylperoxy)hexane.

These peroxides may be used alone or in combination with or without the presence of a catalyst to induce decomposition of the peroxide and increase the rate of radical production. Other oxidizing agents known in the art including quinones such as 2,2',6,6'-tetramethyl-diphenoquinone (TMDQ) may also be used in the presence or absence of a phenol.

This invention comprises a thermosetting resin such as, for example, epoxy, phenolic, alkyds, polyester, polyimide, polyurethane, mineral filled silicone, bis-maleimides, cyanate esters, vinyl, and benzocyclobutene resins. Mixtures of two or more thermosetting resins may also be employed to produce a polyphenylene ether-thermosetting resin. The preferred thermosetting resin comprises an epoxide or mixtures thereof with a phenol such as a bisphenol-A or a partial condensation product of the epoxy and bisphenols thereof. The thermosetting resin composition used herein, either as a constituent or a reactant, preferably includes at least one bisphenol polyglycidyl ether. The bisphenol polyglycidyl ether preferably employed may be halogen free or a mixture of halogen free and halogen containing polyglycidyl ethers in which bromine is the preferred halogen substituent. The total amount of bromine can be about 10–30% by weight.

The epoxide component useful in this invention would include, in its broadest sense, any epoxy compound. Suitable epoxy compounds useful in this formulation include those of Formula (V):

$$A^4\text{---}[X]_n \qquad (V)$$

Wherein A4 is any aromatic, aliphatic, mixed aliphatic-aromatic hydrocarbons, heterocycles or derivatives of the like, X is an epoxy containing residue and n is any integer, preferably from 1–100.

When employing an epoxide, it is preferred that the epoxide comprise at least two epoxy compounds, one being brominated to provide flame retardancy and the other at levels sufficient to provide a total bromine of between 10–30%. Preferred epoxy compounds include those wherein n is 1–4, preferably 2.

Typical to this family of materials are:

1) Diepoxides exemplified in general Formula (VI), wherein A5 and A6 are aromatic radicals and Y is a single bond or a bridging radical. The radicals A5 and A6 may be substituted or unsubstituted with typical groups chosen from aryl, alkyl, alkoxy, halo and the like. Y may include bridging radicals such as a single bond alkyl, cycloalkyl, aryl, oxy, thio, sulfonyl, sulfoxy or carbonyl.

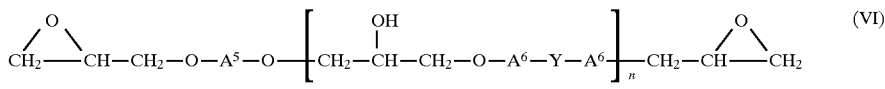

Most common examples of compounds described by Formula (VI) include diglycidyl ethers often produced by the condensation of epichlorohydrin with a bisphenol where n=0. Typical of this class of compounds are the diglycidyl ethers of 4,4'-(1-methylethlyidene) diphenol, 4,4'-(1-methylethlyidene)bis(2-methylphenol), 4,4'-(1-methylethlyidene) bis(2,6-dimethylphenol), 4,4'-(1,1-cyclopentylidene)diphenol, 4,4'-(cyclohexylidene) diphenol, 4,4'-(1-methylethylidene)bis(2,6-dibromophenol), 4,4'-methylenediphenol, 4,4'-(1-methylethyl-idene) bis(2-allylphenol), 4,4'-(1-methylethylidene)bis(2-t-butyl-5-methylphenol), 4,4'-(1-methylethylidene)bis(2-t-butyl-5-methylphenol), 4,4'-(1-methylpropylidene)bis(2-t-butyl-5-methylphenol), 4,4'-(1,4-bis(methylethylidene) phenyl)bis (2-t-butyl-5-methylphenol), 4,4'-biphenol, hydroquinone, resorcinol, and the like. Oligomeric products generated during this condensation reaction are also known and are useful in this invention. Such compounds are exemplified by the oligomeric condensation product of bisphenol-A and epichlorohydrin (n=0.14) sold by Shell corporation under the trade name EPON 828.

2) The reaction products of said diepoxides with bisphenols, commonly referred to as upstaged resins. A typical example includes the condensation product of bisphenol-A diglycidyl ether with tetrabromobisphenol A. The partial condensation products suitable for use may be prepared by heating the mixture of compounds, as hereinabove described, at a temperature in the range of about 50° C. to about 225° C., preferably about 70° C. to about 200° C. and most preferably about 100° C. to about 190° C., in the presence of a catalytic amount of at least one basic reagent, such as copper, amine, phosphine or metal salt.

The triarylphosphines, especially triphenylphosphine, are the preferred basic reagents for the bisphenol-bisepoxide condensation reaction by reason of their effectiveness at low levels, low tendency to cause side reactions and harmlessness when they remain present after the reaction is complete. They are usually employed in the amount of about 0.1% to about 0.5% by weight. The reaction is preferably conducted in an inert atmosphere such as nitrogen, especially when a triarylphosphine is employed as a catalyst. An aromatic hydrocarbon solvent such as toluene, may be employed, but is not critical.

Said partial condensation products may comprise about 25% to about 35% brominated compound and about 15% to about 25% epoxidized novolak, with the balance being the non-brominated biphenol polyglycidyl ether. Lower concentrations of brominated compounds or novolaks may cause an unacceptable decrease in solvent resistance and/or flame resistance. An increase in brominated compound may yield an incompatible material. The preferred proportion of brominated compound is in the range of about 28% to about 32%.

3) Multifunctional epoxides as described by Formula (VII) may also be used.

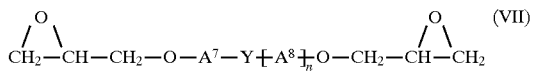

Those materials described by Formula (VII) include all epoxidized phenolic resins including epoxidized novalacs and resols. A7 and A8 are aromatic radicals either substituted or unsubstituted with typical substituting groups chosen from aryl, alkyl, alkoxy, halo, and the like. The value of n may range from 0 to about 500.

Most common examples of compounds described by Formula (VII) include glycidyl ethers produced by the condensation of epichlorohydrin with a phenolic resin. Examples of this class of compounds include the glycidyl ethers of phenol-formaldehyde novalac, cresol-formaldehyde novalac, bromophenol-formaldehyde novalac, t-butylphenol-formaldehyde novalac, phenolic resins derived from the condensation of phenol with a diene or mixtures of dienes, such as dicyclopentadiene or butadiene, or additionally, with a polybutadiene resin.

Other multifunctional epoxides such as phloro-glucinol triglycidyl ether, tetrakis(glycidoxyphenyl)-ethane will also be useful in this invention.

4) Glycidyl ethers of amines, amides, or nitrogen containing heterocycles. These materials may include triglycidylcyanurate, triglycidylisocyanurate, N,N,N'N'-tetraglicidyldiaminodiphenylmethane, N,N,O-triglycidyl-4-aminophenol, N,N-diglycidyl aniline, N,N-diglycidyl hydantoin.

5) Glycidyl ethers of carboxylic acids such as diglycidyl phthalate, diglycidyl tetrahydrophthalate, diglycidyl hexahydrophthalate and diglycidyl adipate.

6) Homopolymers or copolymers prepared from unsaturated epoxides such as glycidyl acrylate, glycidyl methacrylate and allyl glycidyl ether. As mentioned, these materials could be used as homopolymers or copolymers obtained from mixtures of the unsaturated epoxides mentioned above or mixtures of unsaturated epoxides and other vinyl monomers known in the practice of vinyl polymerization.

7) Polysiloxanes containing epoxy functionality such as the glycidyl ether of 1,3-bis(3-hydroxypropyl)tetramethyldisiloxane.

8) Compounds prepared by epoxidation of alkenes, dienes or polyenes, such as phenyl glycidyl ether, allyl glycidyl ether, a-napthylglycidyl ether, B-naphthyl glycidyl ether, bis(2,3-epoxycyclopentenyl) ether, 3,4-epoxycyclohexylmethyl-3,4-epoxycyclohexane carboxylate, vinylcyclohexene dioxide and substituted derivatives thereof. In addition, epoxidized polyenes such as polybutadiene resins or butadiene containing copolymers would be useful.

When the epoxide is a mixture, it usually comprises about 30% to about 60% by weight of the brominated compound and about 5% to about 20% of the epoxidized novolak (when present), with the balance being the non-brominated bisphenol polyglycidyl ether.

Phenolic resins useful in the formulation include those exemplified by Formula (VIII) below. In addition to simple phenols and bisphenols of Formula (VIII), the following bisphenols may be used in the instant invention. Typical of this class of compounds are 2,2-bis(4-hydro-xyphenyl) propane, 2,2-bis(4 -hydroxyphenyl)butane, 2,2-bis(4-hydroxyphenyl)pentane, 1,1-bis(4-hydroxyphenyl)-1-phenylethane, 3,3-bis(4-hydroxyphenyl) pentane, 4,4-bis (4-hydroxyphenyl)heptane, 1,1-bis(4-hydroxphenyl)-2,2,2-trichloroethane, 2,2-bis(4-hydroxyphenyl)-1,1,1,3, 3,3-hexafluoroethane, 1,1-bis(4-hydroxy-phenyl)-1-cyano-ethane,1,1-bis(4-hydroxyphenyl)-1,1-dicyanomethane, 1,1-bis(4-hydroxyphenyl)l-cyano-1-phenyl-methane, 2,2-bis(3- methyl-4,4-hydroxyphenyl)propane, 2,2-bis(3,5-dimethly-4-hdroxyphenyl)propane, 1,1-bis(4-hydroxyphenyl)cyclohexane, 1,1-bis(3-methyl-4,4-hydroxyphenyl) cyclopentane, 1,1-bis(3-methyl-4-hydroxyphenyl)-cyclo-pentane, 1,1-bis (4-hydroxyphenyl)norbornane, 9,9-bis(4-hydroxyphenyl-fluorene, 1,1-bis(4-hydroxyphenyl)phthalide, 1,2-bis(4-hydroxyphenyl)ethane, 1,10-bis(4-hydroxyphenyl)decane, a,a-bis(4-hydroxyphenyl)-1,4-diisopropyl-benzene, a,a-bis (4-hydroxyphenyl)-1,3-diisopropylbenzene, bis(4-hydroxyphenyl)methane, 1,3-bis(4-hydroxyphenyl)-propenone, bis(4-hydroxyphenyl)sulfone, bis(4-hydroxyphenyl) sulfide, 4,4'-(oxydiphenol), 2,2-bis(3-methyl-4-hydroxyphenyl) propane, 2,2-bis(3,5-dimethyl-4-hydroxyphenyl) propane, 2,2-bis(3,5-dimethyl-4-hydroxyphenyl)-methane, bis(4-hydroxyphenyl)methane, 2,2-bis(3-allyl-4-hydro-xyphenyl) propane, 2,2-bis(3-t-butyl-4-hydroxy-6-methylphenyl) propane 2,2-bis(3-tbutyl-4-hydroxy-6-methyl-phenyl) butane, α,α-bis(3,5-dimethyl-4-hydroxyphenyl)-1,4-diisopropylbenzene, α,α-bis(3,5-dimethyl-4-hydroxyphenyl)-1,3-diisopropylbenzene,4,4'-biphenol, hydroquinone, resorcinol, 1,1-bis(4-hydroxy-phenyl)ethane, 1,1-bis(4-hydroxyphenyl)propane, 1,1-bis(4-hydroxyphenyl)butane, 1,1-bis(4-hydroxyphenyl)-1-cyclohohexylmethane, 1,1-bis(4-hydroxyphenyl)-1-phenylmethane.

 (VIII)

Multifunctional oligomeric phenolic resins exemplified by Formula (VIII) (n is greater than 2) are also useful in the present invention. A9 and A10 are aromatic radicals either substituted or unsubstituted with typical substituting groups chosen from aryl, alkyl, halo, alkoxy and the like. Where Y is a bridging group, chosen from alkylidene, or oxydialkydlidene and n is any integer, preferably from 1–100. These materials may include phenol-formaldehyde novalac, cresol-formaldehyde novalac, bromophenol-formaldehyde novalac, t-butyl-formaldehyde novalac, phenol resins derived from the condensation of phenol with dienes such as dicyclo-pentadiene, butadiene or terpene either together or in combination or a polymeric resin such as polybutadiene.

The polyepoxide thermosetting component is just one example of a wide range of thermosetting components useful in the invention. Other useful thermosetting components comprise such materials as vinylic compounds including maleimides, triallylisocyanurate, or triallycyanurate, and/or cyanate esters. These various thermosetting resins can be used either individually with PPE or in combination with one another and a PPE to produce a polyphenylene ether-thermosetting resin.

Vinylic compounds useful in the present invention include broadly any compound with an unsaturated functionality but in particular include those materials described by Formula (IX).

 (IX)

Wherein A11 is any aromatic, aliphatic, mixed aliphatic-aromatic hydrocarbons, heterocycles or derivatives of the like, X is a vinyl residue, and n is any integer, preferably from 1–100.

Vinyl compounds useful in the practice of the instant invention, include materials such as triallylisocyanurate, triallylcyanurate, diallyl-phthalate, diallylisophthalate, diallyl maleate, diallyl-fumarate, diethylene glycol diallylcarbonate, triallyl-phosphate, ethylene glycol diallyl ether, allyl ethers of trimethylolopropane, partial allyl ethers of pentaeryth-ritol, diallyl sebacate, allylated novalacs, allylated resol resins. Vinyl compounds such as those described by Formula (IX) may be used with free radical initiators such as the peroxides described by Formula (IV).

Cyanate esters are most broadly defined by Formula (X)

 (X)

wherein A12 is any aromatic, aliphatic, mixed aliphatic-aromatic hydrocarbons, heterocycles or derivatives of the like, X is a cyanate group, and n is an integer of from 1–10 and preferably from 1–4. Most typical of this class of compounds are those derived from the reaction of cyanogen halides with the bisphenols described above by Formula (VIII).

Resins produced by partial curing of cyanate esters are well known. Such resins, referred to upstaged resins, may also be used in this invention.

Also present in the curable compositions may be materials such as flame retardant synergists such as antimony pentoxide; antioxidants, thermal and ultraviolet stabilizers, lubricants, anti-static agents, dyes, pigments and the like, all in conventional proportions.

The curable thermosetting compositions of this invention generally contain a catalyst known in the art present in quantities effective for curing the composition. The effective amount may vary widely but is ordinarily about 0.5% to about 10.0% and preferably, about 1% to about 5% based on the total weight of the PPE and thermosetting resin as described in the art.

For the formation of prepregs, the curable compositions of the invention are typically dissolved in an effective amount of an inert organic solvent, typically to a solute content of about 15% to about 60% by weight and preferably about 40% to about 60% by weight, and most preferably about 50% to about 60% by weight. The identity of the solvent is not critical, provided it may be removed by suitable means such as evaporation. Because of health hazards, however, alkylated aromatic hydrocarbons, especially toluene, are preferred.

Other aspects of the invention are curable articles comprising a fibrous substrate (woven or non-woven) such as glass, quartz, polyester, polyimide, polypropylene, cellulose, carbon fibers and carbon fibrils, nylon or acrylic fibers, preferably a glass substrate, impregnated with the curable compositions of this invention and typically obtained upon removal of the solvent therefrom by evaporation or the like. Such articles (i.e., prepregs) may be cured by application of heat.

Typically, 2-ply to 20-ply prepreg laminates are compression molded at temperatures in the range of about 170° to about 250° C. and under pressures on the order of 20–60 kg/cm2. Laminates clad with a conductive metal such as copper, useful for printed circuit board production, may be so prepared and cured by art-recognized methods. Printed circuit boards comprising said laminates are characterized by excellent physical dielectric properties. The metal cladding may then be conventionally patterned.

In the practice of this invention when an oxidizing agent is employed, it must be reacted with the PPE. The amount of oxidizing agent employed depends on whether or not an additional component is used. For example, in the event a phenol is also employed, a lesser amount of peroxide agent may be used. It has been found that as little as about 2% by weight and, preferably, as little as about 4% by weight of an oxidizing agent, such as a peroxide may be employed when using a mixture of a peroxide and a phenol. If only a peroxide is employed, then a greater amount may be necessary generally in excess of 4% by weight.

It should be clear that the present invention includes thermoset compositions (i.e., cured compositions) containing PPE (including functionalized PPE) having an average molecular weight of less than about 3,000, preferably about 500 to about 2,900 and, more particularly, about 800 to about 2,200. It should also be clear that the present invention includes the reaction products of thermosetting resins and a PPE having an average molecular weight of less than about 3,000, preferably about 500 to about 2,900 and, more particularly, about 800 to about 2,200. Included by the term thermosetting resins are epoxy, phenolic, alkyds, polyester, polyimide, polyurethane, mineral filled silicone, bis-maleimides, cyanate esters, vinyl, and benzocyclobutene resins. These compositions may further contain various catalysts, flame retardants, curing agents, reinforcing materials and other constituents, if so desired. The thermosetting components, such as those described above, may be used either alone or in combination with one another or with another thermoplastic resin.

It should also be clear that the present invention affords a method to prepare a single phase thermoset by admixing a PPE having an average molecular weight of less than about 3,000, preferably about 500 to about 2,900 and, more particularly, about 800 to about 2,200 and a thermosetting resin. By single phase is meant that the average PPE particle size diameter, as measured by microscopy, is less than 5 microns, preferably less than 2 microns and most preferably, less than 1 micron. The method of the present invention also includes curing the admixture of the aforementioned PPE and thermosetting resin. The thermosetting resin of the method include epoxy, phenolic, alkyds, polyester, polyimide, polyurethane, mineral filled silicone, bis-maleimides, cyanate esters, vinyl, and benzocyclobutene resins, as well as mixtures of the foregoing. It should also be clear that the present invention includes articles made from the thermoset, including articles made from the fiber reinforced thermoset as described herein.

It should further be clear that the present invention encompasses curable compositions for impregnating and preparing cured fibrous substrates in which the curable compositions, when dissolved in an inert solvent, are free of gelation at room temperature. These curable compositions contain in admixture:

(a) the reaction product of at least one polyphenylene ether resin in an inert organic solvent with a co-reactant that is selected from the group consisting essentially of benzoyl peroxide and a mixture of benzoyl peroxide with a bisphenol to afford a polyphenylene ether resin having a number average molecular weight of less than about 3,000;

(b) at least one polyepoxide composition comprising:
 (i) a tetrabromo bisphenol diglycidyl ether, and
 (ii) an epoxy novolak resin; and (c) a catalytic amount of a catalyst.

The curable compositions may optionally contain a condensation product of a bisphenol diglycidyl ether with a tetrabromo bisphenol. In an especially preferred curable composition, the composition has a bromine content of at least about 15% by weight based upon the weight of the curable composition without a fibrous substrate.

All patents cited are incorporated herein by reference.

The following examples are provided to illustrate some embodiments of the present invention. They are not intended to limit the invention in any aspect. All percentages are by weight based on the total weight of the entire composition, unless otherwise indicated.

EXAMPLES

Polyphenylene ether-epoxide compositions were prepared having the compositions as outlined in the following tables. First the polyphenylene ether was dissolved in toluene and tetrabromobisphenol-A diglycidyl ether (E-1) to produce a solution containing approximately 40% solids. The solution was heated to 90°–100° C., followed by addition of bisphenol A and benzoyl peroxide (or, with benzoyl peroxide alone) and maintained at 90°–100° C. for approximately 90 minutes. The solution was allowed to cool and the other epoxy resins (bisphenol-A diglycidyl ether/tetrabromo bisphenol-A condensation product (E-2) and epoxidized novalac (E-3) were added and the amount of toluene adjusted so as to generate a resin solution which was about 55 weight % solids. A catalyst package (zinc octoate, 2-methyl-4-ethylimidazole, and diaminodiethylbenzene) was then added.

A fibrous glass mat substrate was impregnated with each of the resin solutions described in Table 1. Each impregnated mat was heated to remove solvent and partially cure the resin so as to produce a glass reinforced prepreg. Several prepregs of each formulation were layered and heated to about 190° C. for about 3 hours to produce a cured laminate of each of the formulations in Table 1.

On each cured laminate, physical properties were determined and reported in Tables 1 or 2. The following definitions apply in the Table:

| | |
|---|---|
| PPE | polyphenylene ether resin |
| Mn | number average molecular weight |
| Mw | weight average molecular weight |
| BPA | bisphenol-A |
| BPO | benzoyl peroxide |
| E-1 | tetrabromobisphenol-A diglycidyl ether |
| E-2 | bisphenol-A diglycidyl ether/tetrabromobisphenol-A copolymer |
| E-3 | epoxidized phenol formaldehyde novolak |
| E-4 | epoxidized cresol-formaldehyde novolak |
| Catalyst-1 | mixture of 2.90% zinc octoate, 0.33% 2-ethyl-4-methyl imidazole and 0.85% diaminodi ethylbenzene (% is weight % based on weight of total composition) |
| Catalyst-2 | mixture of 3.64% zinc octoate, 0.65% 2-ethyl-4-methyl imidazole and 0.84% diaminodi ethylbenzene (% is weight % based on weight of total composition) |
| Tg | glass transition temperature |
| MeCl2 | methylene chloride |

TABLE I

| Formulation | 1 | 2 | 3 | 4 | 5 | 6 |
|---|---|---|---|---|---|---|
| PPE | 28.9 | 28.5 | 29.0 | 28.9 | 28.9 | 28.9 |
| Mn | 1256 | 1041 | 1495 | 1336 | 5030 | 5030 |
| Mw | 4,964 | 4,128 | 5,187 | 5,229 | 17,590 | — |
| BPA | 1.2 | 1.7 | 0 | 0 | 1.2 | 0 |
| BPO | 1.2 | 1.7 | 1.8 | 2.4 | 1.2 | 0 |
| E-1 | 38.1 | 37.7 | 38.4 | 38.1 | 38.1 | 39.0 |
| E-2 | 13.3 | 13.2 | 13.4 | 13.3 | 13.3 | 13.6 |

TABLE I-continued

| Formulation | 1 | 2 | 3 | 4 | 5 | 6 |
|---|---|---|---|---|---|---|
| E-3 | 13.3 | 13.2 | 13.4 | 13.3 | 13.3 | 13.6 |
| Catalyst | 4.0 | 4.0 | 4.0 | 4.0 | 4.0 | 4.0 |
| PROPERTIES | | | | | | |
| Tg °C. | 164.3 | 167.8 | 173.8 | 171.9 | 178.2 | — |
| Laminate integrity | good | good | good | good | good | poor |
| MeCl2 resistance | good | good | good | good | good | poor |
| Solder resistance | good | good | good | good | good | poor |
| Z-axis expansion, % | 4.1 | 4.2 | 4.2 | 4.3 | 4.0 | — |
| Dielectric constant at 1 MHz | — | 4.5 | 4.7 | — | 4.6 | — |
| Dissipation Factor at 1 MHz | — | 0.01 | 0.01 | — | 0.01 | — |
| Morphology of resin phase | single phase homogeneous | single phase homogeneous | single phase homogeneous | single phase homogeneous | two-phase; not homogeneous | two-phase; not homogeneous |
| Gelation (8 hr. at ca. 23° C.) | none | none | none | none | Yes | Yes |

Examples 1 to 4 illustrate compositions of the present invention. As seen by the data for these examples, a single phase, homogeneous morphology was unexpectedly obtained after curing the thermosetting resin in the laminate. It was also unexpectedly discovered that the solutions did not gel even after holding for eight hours at room temperature (ca. 23° C.). The temperature, solder and chemical resistance for these examples was additionally outstanding.

Examples 5 and 6 are comparative examples utilizing a PPE having a higher molecular weight outside the present invention. These compositions were prepared at 55% solids as in Example 1, using an initial higher molecular weight PPE. The final number average molecular weight of the PPE after reaction with bisphenol-A and benzoyl peroxide was approximately 5000. The resin solution for both Examples 5 and 6 gelled after standing for 8 hours at room temperature.

Laminates were also prepared using the same procedure as in Example 1, except that the glass mat had to be impregnated at about 55° C. in order to keep the resin mixture in solution and to avoid gelation. Analysis of the resin phase in the cured laminate showed that the cured resin did not exhibit a homogeneous single phase and consisted of two phases, one of which was an epoxy rich domains and the other was PPE rich domains.

TABLE 2

| Formulation | 7 | 8 | 9 |
|---|---|---|---|
| PPE | 38.6 | 34.7 | 32.7 |
| Mn | 1256 | 1256 | 1256 |
| Mw | 4,964 | 4,964 | 4,964 |
| BPA | 1.5 | 1.4 | 1.3 |
| BPO | 1.5 | 1.4 | 1.3 |
| E-1 | 40.3 | 40.3 | 40.3 |
| E-4 | 13.2 | 17.2 | 19.2 |
| Catalyst | 5.1 | 5.1 | 5.1 |
| PROPERTIES | | | |
| Tg °C. | 173 | 182 | 180 |
| Laminate integrity | — | — | — |
| MeCl2 resistance | good | good | fair |
| Solder resistance | good | good | good |
| Z-axis expansion, % | — | — | — |
| Dielectric constant at 1 MHz | 4.15 | — | — |
| Dissipation Factor at 1 MHz | 0.01 | — | — |
| Morphology of resin phase | fine grain morphology | fine grain morphology | fine grain morphology |
| Gelation after 8 hours at room temperature | none | none | none |

Examples 7 to 9 additionally illustrate compositions of the present invention without the bisphenol-A diglycidyl ether/tetrabromobisphenol-A copolymer (i.e., E-2). As seen by the data for these examples, fine grain morphology were unexpectedly obtained after curing the thermosetting resin in the laminates. By fine grain is meant that the dispersed phase had an average particle size of less than about 5 microns and was further very uniform (i.e., a narrow distribution of particle sizes). For comparative purposes, Example 5 in Table 1 (a control) exhibited an irregular dispersed phase having dispersed domains between about 10 microns and about 70 microns. It was also unexpectedly discovered that the solutions did not gel even after holding for eight hours at room temperature (ca. 23° C.). The temperature, solder and chemical resistance for these examples was additionally outstanding.

While the invention has been described and illustrated in connection with certain preferred embodiments thereof, it will be apparent to those skilled in the art that the invention is not limited thereto. Accordingly, it is intended that the appended claims cover all modifications which are within the spirit and scope of this invention.

What is claimed is:

1. A curable resin composition comprising:
   (a) at least one polyphenylene ether resin having a number average molecular weight between about 500 to about 2,900 wherein said polyphenylene ether resin comprises a functionalized polyphenylene ether resin and wherein said functionalized polyphenylene ether resin contains at least one species of the group consisting of acid, anhydride, amine, epoxy, oxazoline, orthoester, hydroxyl, phosphate, and phosphonate, and
   (b) at least one thermosetting resin selected from the group consisting of phenolic, alkyds, polyester, polyurethane, mineral filled silicone, cyanate esters, vinyl, and benzocyclobutene resins.

2. The curable resin composition of claim 1, wherein said polyphenylene ether resin has a number average molecular weight between about 800 to about 2,200.

3. The curable resin composition of claim 1, wherein said functionalized polyphenylene ether resin is the reaction product of at least one polyphenylene ether resin with a peroxide or with a peroxide and a phenol.

4. The curable resin composition of claim 3, wherein said phenol is a bisphenol.

5. The curable resin composition of claim 1, wherein said functionalized polyphenylene ether resin is a reaction product of at least one polyphenylene ether resin with benzoyl peroxide or a mixture of benzoyl peroxide and a phenol.

6. The curable resin composition of claim 5, wherein said phenol is a bisphenol.

7. The curable resin composition of claim 1, further comprising at least one additional component of the group consisting of catalysts, fibrous substrates, reinforcing agents, flame retardants, organic solvents, and curing agents.

8. A thermoset composition made from the curable resin composition of claim 1.

9. The thermoset composition of claim 8, wherein the thermoset composition is reinforced with a fibrous substrate.

10. The thermoset composition of claim 8, wherein the average polyphenylene ether resin particle size diameter, as measured by microscopy, is less than 5 microns.

11. An article made from the thermoset composition of claim 8.

12. The thermoset composition of claim 8, wherein said thermosetting resin is a phenolic resin.

13. The thermoset composition of claim 8, wherein said thermosetting resin is an alkyd resin.

14. The thermoset composition of claim 8, wherein said thermosetting resin is a polyester resin.

15. The thermoset composition of claim 8, wherein said thermosetting resin is a polyurethane resin.

16. The thermoset composition of claim 8, wherein said thermosetting resin is a mineral filled silicone resin.

17. The thermoset composition of claim 8, wherein said thermosetting resin is a cyanate ester resin.

18. The thermoset composition of claim 8, wherein said thermosetting resin is a vinyl resin.

19. The thermoset composition of claim 8, wherein said thermosetting resin is a benzocyclobutene resin.

20. The curable resin composition of claim 1, wherein said thermosetting resin is a phenolic resin.

21. The curable resin composition of claim 1, wherein said thermosetting resin is an alkyd resin.

22. The curable resin composition of claim 1, wherein said thermosetting resin is a polyester resin.

23. The curable resin composition of claim 1, wherein said thermosetting resin is a polyurethane resin.

24. The curable resin composition of claim 1, wherein said thermosetting resin is a mineral filled silicone resin.

25. The curable resin composition of claim 1, wherein said thermosetting resin is a cyanate ester resin.

26. The curable resin composition of claim 1, wherein said thermosetting resin is a vinyl resin.

27. The curable resin composition of claim 1, wherein said thermosetting resin is a benzocyclobutene resin.

28. A thermoset composition made from a curable resin composition consisting essentially of:
   (a) at least one polyphenylene ether resin having a number average molecular weight between about 500 to about 2,900 wherein said polyphenylene ether resin comprises a functionalized polyphenylene ether resin and wherein said functionalized polyphenylene ether resin contains at least one species of the group consisting of acid, anhydride, amine, epoxy, oxazoline, orthoester, hydroxyl, phosphate, and phosphonate, and
   (b) at least one thermosetting resin selected from the group consisting of phenolic, alkyds, polyester, polyurethane, mineral filled silicone, cyanate esters, vinyl, and benzocyclobutene resins.

29. The thermoset composition of claim 28, wherein the curable resin composition further consists essentially of at least one additional component of the group consisting of fibrous substrates, reinforcing agents, catalysts, flame retardants, organic solvents, and curing agents.

30. The thermoset composition of claim 28, wherein said thermosetting resin is a phenolic resin.

31. The thermoset composition of claim 28, wherein said thermosetting resin is an alkyd resin.

32. The thermoset composition of claim 28, wherein said thermosetting resin is a polyester resin.

33. The thermoset composition of claim 28, wherein said thermosetting resin is a polyurethane resin.

34. The thermoset composition of claim 28, wherein said thermosetting resin is a mineral filled silicone resin.

35. The thermoset composition of claim 28, wherein said thermosetting resin is a cyanate ester resin.

36. The thermoset composition of claim 28, wherein said thermosetting resin is a vinyl resin.

37. The thermoset composition of claim 28, wherein said thermosetting resin is a benzocyclobutene resin.

38. The thermoset composition of claim 28, wherein said polyphenylene ether resin has a number average molecular weight between about 800 to about 2,200.

39. A reaction product of a curable resin composition comprising:
   (a) at least one polyphenylene ether resin having a number average molecular weight between about 500 to about 2,900 wherein said polyphenylene ether resin comprises a functionalized polyphenylene ether resin and wherein said functionalized polyphenylene ether resin contains at least one species of the group consisting of acid, anhydride, amine, epoxy, oxazoline, orthoester, hydroxyl, phosphate, and phosphonate, and
   (b) at least one thermosetting resin selected from the group consisting of phenolic, alkyds, polyester, polyurethane, mineral filled silicone, cyanate esters, vinyl, and benzocyclobutene resins.

40. The reaction product of claim 39, wherein said thermosetting resin is a phenolic resin.

41. The reaction product of claim 39, wherein said thermosetting resin is an alkyd resin.

42. The reaction product of claim 39, wherein said thermosetting resin is a polyester resin.

43. The reaction product of claim 39, wherein said thermosetting resin is a polyurethane resin.

44. The reaction product of claim 39, wherein said thermosetting resin is a mineral filled silicone resin.

45. The reaction product of claim 39, wherein said thermosetting resin is a cyanate ester resin.

46. The reaction product of claim 39, wherein said thermosetting resin is a vinyl resin.

47. The reaction product of claim 39, wherein said thermosetting resin is a benzocyclobutene resin.

48. The reaction product of claim 39, wherein said polyphenylene ether resin has a number average molecular weight between about 800 to about 2,200.

49. A curable composition for impregnating and preparing cured fibrous substrates and which composition when dissolved in an inert solvent is free of gelation at room temperature, said composition comprising in admixture:
   (a) the reaction product of at least one polyphenylene ether resin in an inert organic solvent with a co-reactant that is selected from the group consisting of an oxidizing agent and mixtures of an oxidizing agent with a phenol to afford a polyphenylene ether resin having a number average molecular weight between about 500 to about 2,900;
   (b) at least one polyepoxide composition comprising:
      (i) a tetrabromo bisphenol diglycidyl ether, and
      (ii) an epoxy novolak resin;
      wherein the polyepoxy composition further comprises a condensation product of a bisphenol diglycidyl ether with a tetrabromo bisphenol, and
   (c) a catalytic amount of a catalyst.

50. The curable composition of claim 49, wherein said composition has a bromine content of at least about 15% by weight based upon the weight of the curable composition without a fibrous substrate.

51. The curable resin composition of claim 49, wherein said polyphenylene ether resin has a number average molecular weight between about 800 to about 2,200.

* * * * *